United States Patent
Wu

(10) Patent No.: US 7,884,385 B2
(45) Date of Patent: Feb. 8, 2011

(54) LIGHT EMITTING DIODE DEVICE

(75) Inventor: Yi-Tsuo Wu, Jhonghe (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 346 days.

(21) Appl. No.: 12/212,432

(22) Filed: Sep. 17, 2008

(65) Prior Publication Data

US 2009/0072261 A1    Mar. 19, 2009

(30) Foreign Application Priority Data

Sep. 17, 2007    (TW)    ............................... 96134718 A

(51) Int. Cl.
*H01L 33/00*    (2010.01)
(52) U.S. Cl. ........................ 257/98; 257/99; 257/100; 257/675; 257/707; 257/E33.066; 257/E33.075
(58) Field of Classification Search ........... 257/98–100, 257/625, 670, 675, 687, 693, 706, 707, 735, 257/784, 796, E33.066, E33.067, E33.068, 257/E33.075, 676, 720, E33.056; 438/26, 438/29, 122, 126
See application file for complete search history.

(56) References Cited

U.S. PATENT DOCUMENTS

| 7,019,334 | B2* | 3/2006 | Yatsuda et al. | ................. | 257/98 |
| 7,246,930 | B2* | 7/2007 | Yatsuda et al. | .............. | 362/539 |
| 7,332,802 | B2* | 2/2008 | Konno | ......................... | 257/690 |
| 2006/0091403 | A1 | 5/2006 | Chang et al. | | |
| 2007/0176182 | A1* | 8/2007 | Wen et al. | ....................... | 257/79 |
| 2007/0272839 | A1* | 11/2007 | Schultz et al. | ......... | 250/227.31 |
| 2008/0023721 | A1* | 1/2008 | Lee et al. | ....................... | 257/99 |
| 2008/0191232 | A1* | 8/2008 | Lee et al. | ....................... | 257/98 |
| 2009/0021180 | A1* | 1/2009 | Underwood et al. | ........ | 315/291 |
| 2009/0065792 | A1* | 3/2009 | Thompson et al. | ............ | 257/98 |
| 2009/0267093 | A1* | 10/2009 | Kamada et al. | ................ | 257/98 |
| 2009/0311811 | A1* | 12/2009 | Oh et al. | ....................... | 438/28 |
| 2009/0321773 | A1* | 12/2009 | Park et al. | ...................... | 257/98 |

FOREIGN PATENT DOCUMENTS

| CN | 2570988 | 9/2003 |
| CN | 1601768 | 3/2005 |
| JP | 2007-214522 | 8/2007 |

* cited by examiner

*Primary Examiner*—Matthew C Landau
*Assistant Examiner*—Joseph C Nicely
(74) *Attorney, Agent, or Firm*—Muncy, Geissler, Olds & Lowe, PLLC

(57) ABSTRACT

A light emitting diode device includes a substrate, a light emitting diode chip, a plurality of wires, a plurality of lead frames, an insulating body, an encapsulant and a lens. The light emitting diode chip is electrically connected with a lead frame and the substrate. The substrate is electrically connected with another lead frame. Hence, the length of the wires can be decreased, and the reliability of the light emitting diode device can be improved.

16 Claims, 2 Drawing Sheets

LIGHT EMITTING DIODE DEVICE

RELATED APPLICATIONS

This application claims priority to Taiwan Application Serial Number 96134718, filed Sep. 17, 2007, which is herein incorporated by reference.

BACKGROUND

1. Field of the Invention

The present invention relates to a light emitting diode (LED). More particularly, the present invention relates to a light emitting diode with shortened conducting wires to improve component's reliability.

2. Description of Related Art

With progress in chip manufacturing, the operating power of light emitting diodes has been improved to comply with light source standards. Following light source standards have become increasingly important in the heat dissipating designs of light emitting diodes.

When the chips are lit, the light emitting diodes generate heat. This heat must be dissipated. Currently the heat is dissipated from the interior of the light emitting diode through a metallic heat sink connected to the bottom of the chip. In order to enhance heat dissipating efficiency, the metallic heat sink is typically bulky, which results in increasing the volume of the entire light emitting diode device structure, and elongates wires for electrical connection between the chip and the leads or substrate.

When the light emitting diode is operated in environments with extreme temperature variations, the wires are easily pulled by the differentiation of the coefficient of thermal expansion between different packaging materials or components, and eventually break causing product reliability problems of the light emitting diode.

Refer to FIG. 1. A conventional design of a light emitting diode 100 is illustrated. The light emitting diode 100 comprises a heat sink 110, a chip 120, a first wire 131, a second wire 132, a first lead 141, a second lead 142, an insulating housing 150, a packaging member 160 and a lens 170. The insulating housing 150 may be insulating plastic.

The chip 120 is an LED chip and is mounted on the heat sink 110. The wires 131 and 132 respectively connect the chip 120 with the leads 141 and 142 so as to establish the electrical connection to provide electricity to the chip 120. The insulating housing 150 holds the heat sink 110 and the leads 141 and 142 in position. The packing member 160 may use resin and is injected to cover the chip 120 and the wires 131, 132 around the inside of the insulating housing 150. The lens 170 encapsulates the packing member 160 with the insulating housing 150 and the heat sink 110 to form the light emitting diode 100.

When the heat sink 110 is bulky or its size is increased, the lengthy wires 131 and 132 may be pulled and dragged to break because of differentiation of the coefficient of thermal expansion among the package member 160, the wires 131 and 132, the heat sink 110 etc. in environments with extreme temperature variations. Thus, the product's reliability is lowered.

Therefore, there is a need to provide an improved light emitting diode device having simplified structure and high heat dissipating efficiency without changing substantially current production process to mitigate or obviate the aforementioned problems.

SUMMARY

An object of the present invention is to provide a light emitting diode device with high heat dissipating efficiency.

A light emitting diode (LED) device comprises a substrate, a light emitting diode (LED) chip, a plurality of lead frames and three wires. The substrate has a conductive layer. The LED chip is mounted on the substrate. The lead frames have a first lead frame and a second lead frame. The first wire of the wires is electrically connected to the LED chip and the first lead frame, the second wire of the wires is electrically connected to the chip and the conductive layer, and the third wire of the wires is electrically connected to the conductive layer and the second lead frame.

The LED device also has an insulating body and an encapsulant. The insulating body encloses the LED chip and holds the substrate, the first lead frame and the second lead frame to fix them in position. The encapsulant is injected into the interior of the insulating body to cover the LED chip, the substrate and the wires.

Therefore, the LED device adopts multiple wires to establish an electricity conduction path. The wires do not need to be elongated when the volume or the size of the substrate is increased. Pulling and dragging effects caused by differentiation of the coefficient of thermal expansion among the LED chip, the package member, the wires, the substrate etc. in environments with extreme temperature variations are eliminated and diminished. Thus, the product's reliability for the light emitting diode device has been improved.

According to this invention, another light emitting diode (LED) device comprises a substrate, a light emitting diode (LED) chip, a plurality of lead frames and three wires. The substrate has a conductive layer. The LED chip is mounted on the substrate. The LED chip has a first electrode and a second electrode. The first wire of the three wires is electrically connected to the first electrode and a circuit board, the second wire of the three wires is electrically connected to the second electrode and the conductive layer, and the third wire of the three wires is electrically connected to the conductive layer and the circuit board.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
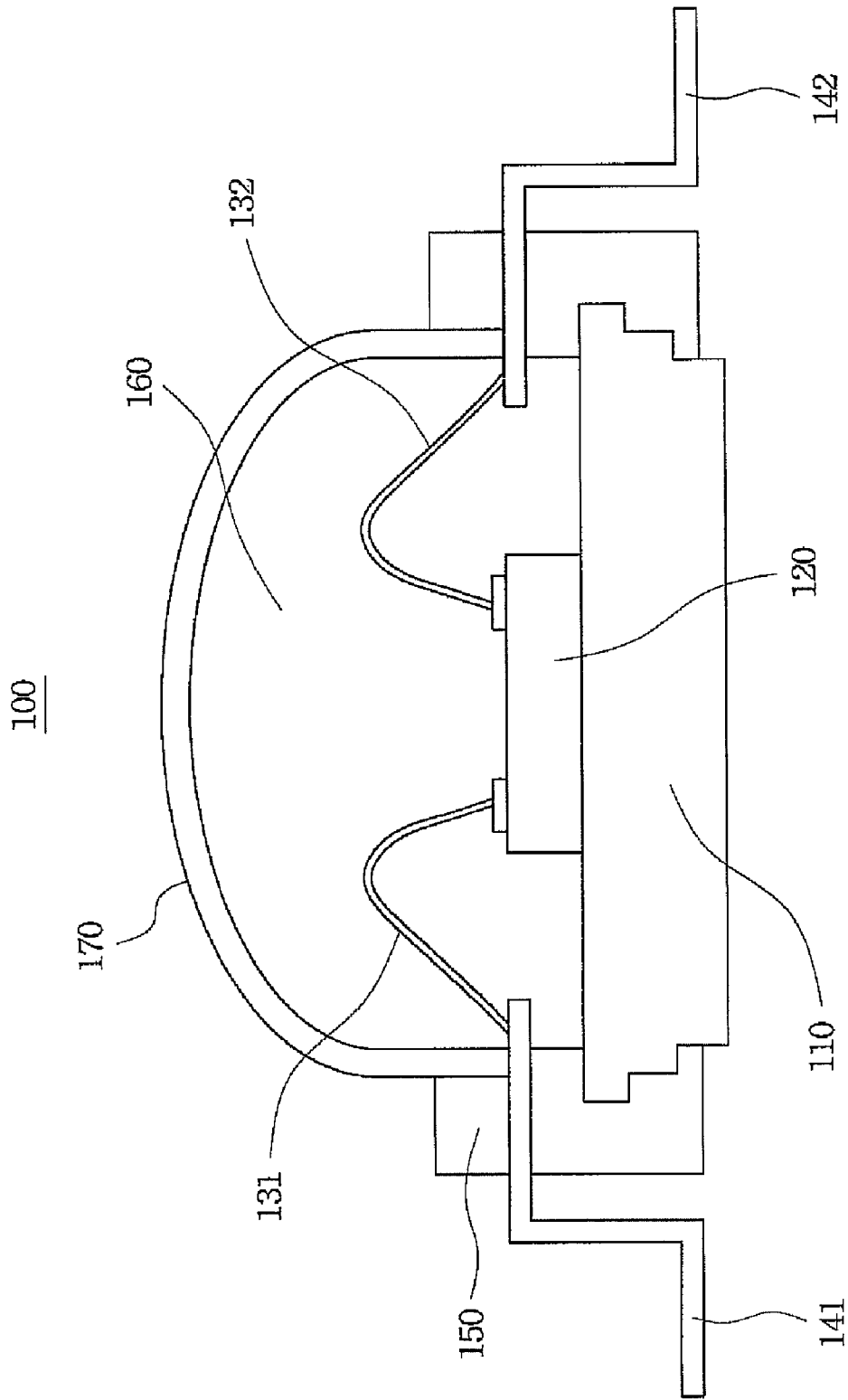
FIG. 1 is a schematic view of a light emitting diode device in accordance with the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
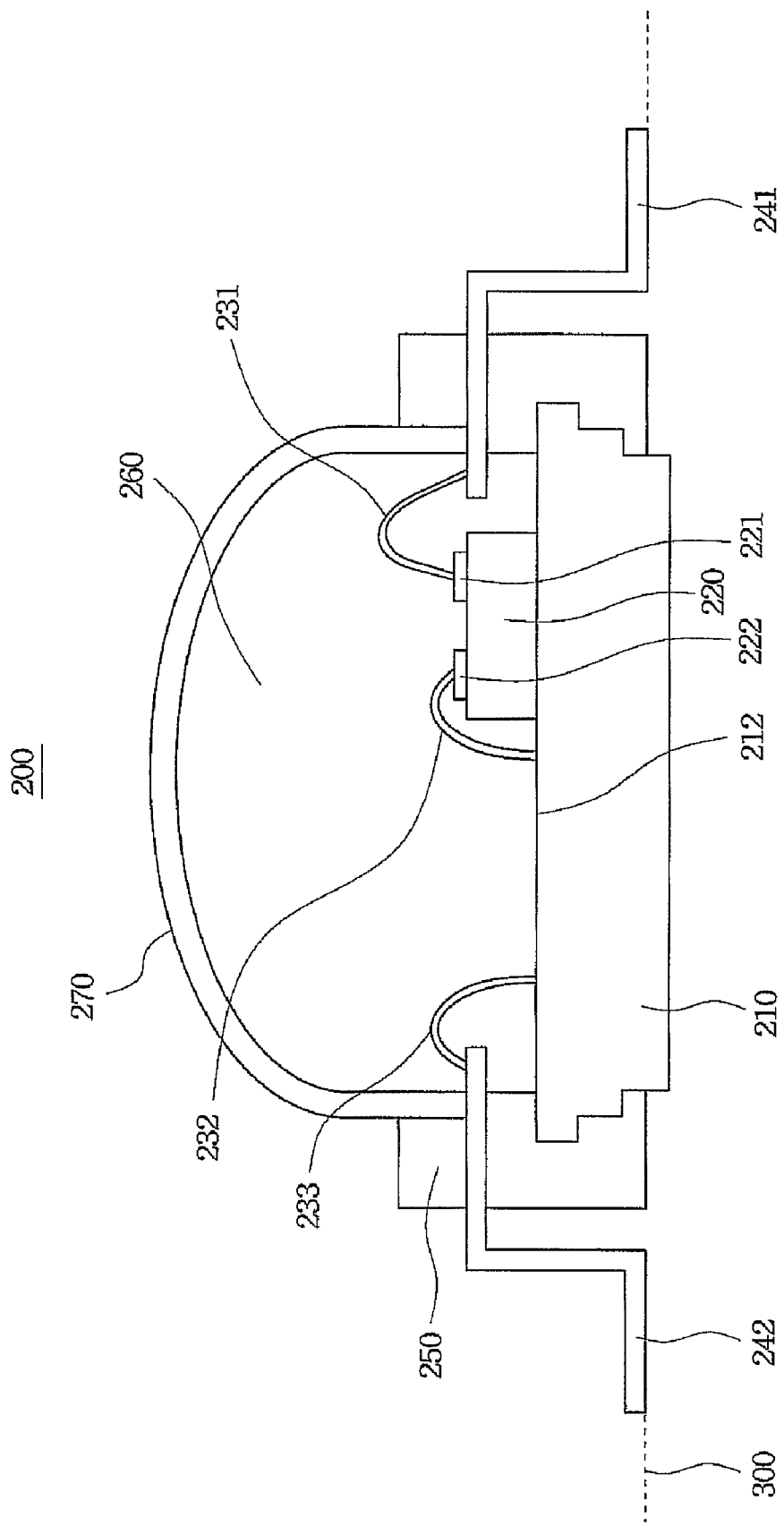
FIG. 2 is a schematic view of a light emitting diode device in accordance with the present invention.

Refer to FIG. 2. An embodiment of a light emitting diode (LED) device 200 comprises a substrate 210 (e.g. a heat sink and the like) having a conductive layer 212 thereon, a chip 220 having a first electrode 221 and a second electrode 212, a first wire 231, a second wire 232, a third wire 233, a plurality of lead frames such as a first lead frame 241 and a second lead frame 242, an insulating body 250, an encapsulant 260 and a lens 270. In this embodiment, the insulating body 250 may be insulating plastic.

The substrate 210 may be made of materials with good thermal and electrical conductivity, such as copper, aluminum, copper alloy, aluminum alloy etc. or the substrate 210 may be a ceramic/metal composite substrate having a conductive trace thereon.

The chip 220 is a light emitting diode (LED) chip and is mounted on the substrate 210. The first wire 231 electrically connects the first electrode 221 of the chip 220 to a circuit board 300 via the first lead frame 241. The second wire 232 electrically connects the second electrode 212 of the chip 220 to the conductive layer 212 of the substrate 210. The third wire 233 electrically connects the conductive layer 212 of the substrate 210 to the circuit board 300 via the second lead frame 242. Thus, a conduction path is established for the electricity with the wires 231, 232, and 233 and the substrate 210 among the chip 220 and the two leads 241 and 242.

The insulating body 250 encloses the chip 220 and holds the substrate 210, the first lead frame 241 and the second lead frame 242 to fix in position. The encapsulant 260, such as resin, is injected into the interior of the insulating body 250 on which the encapsulant 260 is to cover the chip 220, the substrate 210 and the wires 231, 232 and 233. The lens 270 is mounted on the insulating body 250 and encapsulates the substrate 210 and the insulating body 250 and the encapsulant 260 therebetween to form the light emitting diode device 200.

Therefore, the aforementioned light emitting diode device 200 does not require the use of lengthy wires to electrically connect the chip 220 with the lead frames 241 and 242 when the substrate 210 is big or bulky. Instead, the wires 231, 232 and 233 are shortened in the embodiment. When the substrate 210 is bulky or its size is increased, the chip 220 may be mounted at a location near to the first lead frame 241. Thus, the first wire 231 may be shortened, and connects the chip 220 to the first lead frame 241. The second wire 232 connects the chip 220 to the substrate 210. The third wire 233 connects the substrate 210 to the second lead frame 242. Thus, electricity is conducted to the chip 220 through the lead frames 241 and 242 without using lengthy wires.

Therefore, the second wire 232 and the third wire 233 do not need to be elongated when the volume or the size of the substrate 210 is increased. Pulling and dragging effects caused by differentiation of the coefficient of thermal expansion among the chip 220, the encapsulant 260, the wires 231, 232, 233, the substrate 210 etc. in environments with extreme temperature variations are eliminated and diminished. Thus, the product's reliability for the light emitting diode device has been improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) device, comprising:
a substrate having a conductive layer;
a light emitting diode (LED) chip mounted on the substrate;
a plurality of lead frames having a first lead frame and a second lead frame;
a first wire electrically connected to the chip and the first lead frame;
a second wire electrically connected to the chip and the conductive layer; and
a third wire electrically connected to the conductive layer and the second lead frame.

2. The LED device of claim 1, further comprising an insulating body enclosing the LED chip such that the substrate and the lead frames are fixed.

3. The LED device of claim 2, further comprising an encapsulant filled into the insulating body to cover the LED chip and the substrate.

4. The LED device of claim 3, wherein the encapsulant comprises a resin.

5. The LED device of claim 3, further comprising a lens on the insulating body and the encapsulant.

6. The LED device of claim 1, wherein the substrate is a heat sink.

7. The LED device of claim 1, wherein the substrate comprises a metal substrate or a ceramic substrate having a conductive trace thereon.

8. The LED device of claim 7, wherein the substrate is made of one of copper, aluminum, copper alloy, aluminum alloy and combinations thereof.

9. A light emitting diode (LED) device, comprising:
a substrate having a conductive layer;
a light emitting diode (LED) chip mounted on the substrate, the LED chip having a first electrode and a second electrode;
a first wire electrically connected to the first electrode and a circuit board;
a second wire electrically connected to the second electrode and the conductive layer; and
a third wire electrically connected to the conductive layer and the circuit board.

10. The LED device of claim 9, further comprising an insulating body enclosing the chip.

11. The LED device of claim 10, further comprising an encapsulant filled into the insulating body to cover the LED chip and the substrate.

12. The LED device of claim 11, wherein the encapsulant comprises a resin.

13. The LED device of claim 11, further comprises a lens on the insulating body and the encapsulant.

14. The LED device of claim 9, wherein the substrate is a heat sink.

15. The LED device of claim 9, wherein the substrate comprises a metal substrate or a ceramic substrate having a conductive trace thereon.

16. The LED device of claim 15, wherein the substrate is made of one of copper, aluminum, copper alloy, aluminum alloy and combinations thereof.

* * * * *